United States Patent
Yancey et al.

(10) Patent No.: US 11,019,713 B2
(45) Date of Patent: May 25, 2021

(54) ASYMMETRICAL BALLAST TRANSFORMER

(71) Applicant: Atmospheric Plasma Solutions, Inc., Cary, NC (US)

(72) Inventors: Peter J. Yancey, Cary, NC (US); Terrence E. Rogers, Durham, NC (US)

(73) Assignee: Atmospheric Plasma Solutions, Inc., Cary, NC (US)

( * ) Notice: Subject to any disclaimer, the term of this patent is extended or adjusted under 35 U.S.C. 154(b) by 0 days.

(21) Appl. No.: 17/085,604

(22) Filed: Oct. 30, 2020

(65) Prior Publication Data

US 2021/0051790 A1   Feb. 18, 2021

Related U.S. Application Data

(63) Continuation of application No. PCT/US2020/028373, filed on Apr. 15, 2020.

(60) Provisional application No. 62/834,947, filed on Apr. 16, 2019, provisional application No. 62/834,545, filed on Apr. 16, 2019, provisional application No. 62/834,119, filed on Apr. 15, 2019.

(51) Int. Cl.
| | |
|---|---|
| *H01F 27/28* | (2006.01) |
| *H05H 1/30* | (2006.01) |
| *H01F 27/24* | (2006.01) |
| *H01F 38/10* | (2006.01) |
| *H01F 27/32* | (2006.01) |
| *H05B 41/16* | (2006.01) |

(52) U.S. Cl.
CPC .............. *H05H 1/30* (2013.01); *H01F 27/24* (2013.01); *H01F 27/2876* (2013.01); *H01F 27/325* (2013.01); *H01F 38/10* (2013.01); *H05B 41/16* (2013.01)

(58) Field of Classification Search
CPC ...... H05H 1/30; H05B 41/16; H01F 27/2876; H01F 27/325; H01F 27/24; H01F 38/10
See application file for complete search history.

(56) References Cited

U.S. PATENT DOCUMENTS

| | | |
|---|---|---|
| 3,418,527 A | 12/1968 | Miller |
| 6,969,957 B2 | 11/2005 | Ellams |
| 7,022,935 B1 | 4/2006 | Matus et al. |
| 7,298,091 B2 | 11/2007 | Pickard et al. |

(Continued)

FOREIGN PATENT DOCUMENTS

WO    2020214742 A1    10/2020

OTHER PUBLICATIONS

International Search Report and Written Opinion dated Jul. 16, 2020 by the ISA/US for related application PCTUS2028373 (18 pages).

*Primary Examiner* — Tuyen T Nguyen
(74) *Attorney, Agent, or Firm* — Olive Law Group, PLLC (57) ABSTRACT

A ballast transformer and system using the ballast transformer to couple power to a plasma load. The ballast transformer has a magnetic core, a first primary winding on a primary side of the magnetic core, a secondary winding on a secondary side of the magnetic core, and a second primary winding connected in series with the first primary winding and wound in proximity to the secondary winding on the secondary side of the magnetic core. The first primary winding is connectable to the AC power source, and the secondary winding is connectable to the plasma load via a coaxial cable.

20 Claims, 8 Drawing Sheets

(56) References Cited

U.S. PATENT DOCUMENTS

| | | | | |
|---|---|---|---|---|
| 2004/0124779 A1* | 7/2004 | Howald | ............... | H01J 37/321 |
| | | | | 315/111.51 |
| 2016/0251240 A1* | 9/2016 | Fraser | .................... | C02F 1/008 |
| | | | | 204/664 |
| 2019/0242850 A1* | 8/2019 | Deivasigamani | .... | G01N 27/626 |

* cited by examiner

ASYMMETRICAL BALLAST TRANSFORMER

CROSS REFERENCE TO RELATED APPLICATIONS

This application is related to and claims priority to PCT/US/20/28373 (entire contents of which are incorporated herein by reference), filed Apr. 15, 2020 entitled "Asymmetrical Ballast Transformer," which is related to and claims priority to U.S. Ser. No. 62/834,119 filed Apr. 15, 2019, entitled "Asymmetrical Ballast Transformer," the entire contents of which are incorporated herein by reference. This application is related to and claims priority to U.S. Ser. No. 62/834,947 filed Apr. 16, 2019, entitled "Waveform Detection of States and Faults in Plasma Inverters," the entire contents of which are incorporated herein by reference. This application is related to and claims priority to U.S. Ser. No. 62/834,545 filed Apr. 16, 2019, entitled "Frequency Chirp Resonant Optimal Ignition Method," the entire contents of which are incorporated herein by reference.

BACKGROUND OF THE INVENTION

Field of Invention

The invention relates to the use of transformers for power coupling to reactive loads, such as plasmas, and other loads where transients need to be suppressed.

Discussion of the Background

Plasmas have been used extensively in a wide variety of industrial and high technology applications including, for example, semiconductor fabrication, various surface modifications, and coatings of reflective films for window panels and compact disks. Plasmas ranging in pressure from high vacuum (<0.1 mTorr) to several Torr are common and have been used for film deposition, reactive ion etching, sputtering and various other forms of surface modifications. For example, gas plasmas are known for the treatment of plastics and molded substrates (e.g., thermoplastic olefin substrates used as bumpers and fascia in the automotive industry) to improve adhesion of subsequently applied coating layers. The modification typically is a few molecular layers deep, thus bulk properties of the polymeric substrate are unaffected. A primary advantage of using plasma for such purposes is that it results in an "all dry" process that generates little or no effluent, does not require hazardous conditions such as high pressures, and is applicable to a variety of vacuum-compatible materials, including, inter alia, silicon, metals, glass and ceramics.

It is commonly known to use plasma, typically $O_2$ plasmas, as a means of removing hydrocarbon and other organic surface contaminants from various substrates. However, because of the short lifetime of these reactants and their line-of-sight reactivity on the surface, these highly activated reactants are not especially well-suited for surface cleaning of irregular surfaces, unpolished or roughened metallic surfaces, or surfaces having a three-dimensional topography.

Also, use of plasma at reduced pressures has several disadvantages in that the substrate to be treated or cleaned must be placed under vacuum and must be capable of surviving under such reduced pressure conditions. Use of a plasma at or above atmospheric pressure avoids these drawbacks.

Yet, the coupling of power into atmospheric pressure plasmas is not straight forward, especially during the time frame when the gas transitions into a plasma. The gas presents a high impedance to the power source, while the resultant plasma appears as a low impedance load to the power source, with the transition from these states resulting in a dynamic change in impedance and current surges.

SUMMARY

In one embodiment of the invention, there is provided a ballast transformer having a magnetic core, a first primary winding on a primary side of the magnetic core, a secondary winding on a secondary side of the magnetic core, and a second primary winding connected in series with the first primary winding and wound in proximity to the secondary winding on the secondary side of the magnetic core.

In one embodiment of the invention, there is provided a system for coupling power to a plasma load, the system comprising: an alternating current (AC) power source; a ballast transformer having a magnetic core, a first primary winding on a primary side of the magnetic core and connected to the AC power source, a secondary winding on a secondary side of the magnetic core, and a second primary winding connected in series with the first primary winding and wound coaxial to the secondary winding on the secondary side of the magnetic core. The system has a coaxial cable for connecting the secondary winding to the plasma load.

In one embodiment of the invention, there is provided a method for providing/coupling power to a plasma load, the method comprising: providing power from an AC power source to a plasma load via the asymmetric ballast transformer in any of the statements above having a sufficient leakage inductance to prevent current surges; and igniting and developing a full atmospheric pressure plasma.

In one embodiment of the invention, there is provided a method for coupling power to a plasma load using the system described above, the method includes coupling power from the AC power source to the plasma load via an asymmetric ballast transformer having a leakage inductance and attached to a coaxial cable with capacitance; while in a no-plasma state, generating a near-resonance voltage on the secondary side due to the leakage inductance and the capacitance; and igniting a plasma at the near-resonance voltage and thereafter decreasing an operational frequency of the AC power source.

It is to be understood that both the foregoing general description of the invention and the following detailed description are exemplary, but are not restrictive of the invention.

BRIEF DESCRIPTION OF THE FIGURES

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1A:
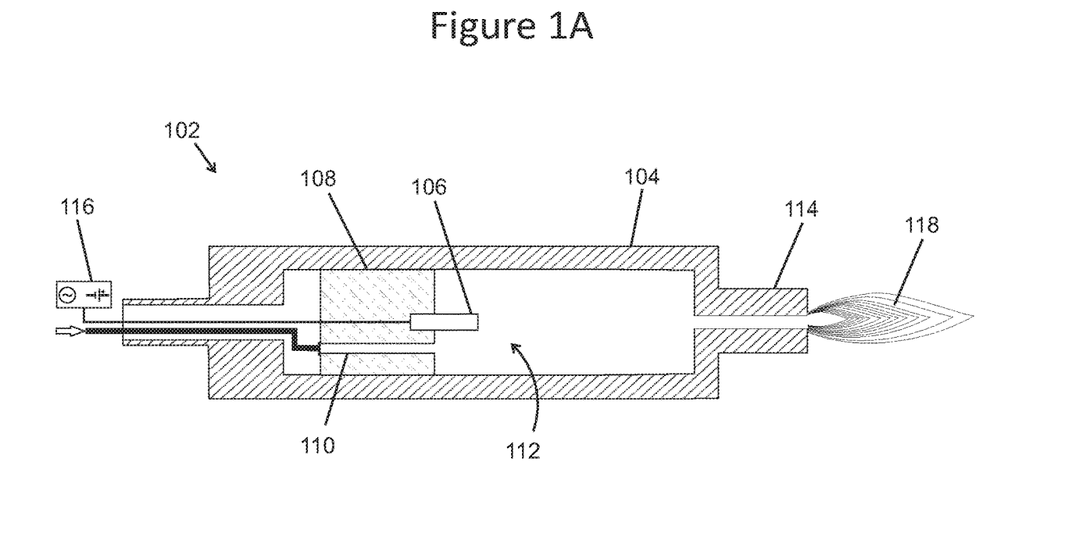
FIG. 1A is a schematic of an atmospheric plasma source.

FIG. 1A is a lengthwise cross-sectional view of an example of an AP plasma source 102. The AP plasma source 102 includes an axially elongated plasma-generating chamber 104 or other structure that serves as a ground electrode for generating a plasma and that serves as a conduit for flowing gases into the plasma. The plasma-generating chamber 104 may be enclosed in an electrically- and thermally-insulating housing (not shown). A "hot" or powered electrode 106 is located in the plasma-generating chamber 104. Electrical connections to the hot electrode 106 may be made through a dielectric structure 108 located at the proximal end of or in the plasma-generating chamber 104. One or more gas inlets 110 may be formed through the dielectric structure 108 in fluid communication with the plasma-generating chamber 104. The gas inlets 108 may be placed in fluid communication with a gas supply source. Accordingly, the gas inlets 110 provide a flow path for plasma-generating gas fed to plasma-generating region 112 within the plasma-generating chamber 104 proximate to the hot electrode 106. In operation, the plasma is generated in region 112 and subsequently flows (with the gas flow) toward a nozzle 114 positioned at a distal end of the plasma-generating chamber 104.

Generally, operating parameters associated with the AP plasma source 102 are selected so as to produce a stable plasma discharge. Control 116 having a processor is used for setting and controlling the operating parameters which depend on the particular application ranging, for example, from nanoscale etching of micro-fabricated structures or devices (e.g., MEMS devices) to removing large areas of paint from aircraft carriers. Examples of operating parameters are provided below with the understanding that the teachings herein are not limited by such examples. In the case of generating an air plasma, the rate at which the air is fed to the AP plasma source 102 may range from $1 \times 10^{-6}$ SCCM to $1 \times 10^6$ SCCM. The feed pressure into the AP plasma source 102 may range from 1 Pa to $1 \times 10^7$ Pa. The power level of the electrical field driving the plasma may range from $1 \times 10^{-6}$ W to $1 \times 10^6$ W. The drive frequency of the electrical field may range from DC (0 GHz) to 100 GHz. The separation distance, i.e. the distance from the nozzle exit to the exposed surface of the material to be removed, may range from $1 \times 10^{-6}$ m to 40 cm. The scan speed, i.e. the speed at which the AP plasma source 102 may be moved across (over) the surface of the material, may range from $1 \times 10^{-4}$ m/s to 10 m/s. Related to the scan speed and power is the time averaged power density. Also related to the scan speed is the dwell time, i.e., the period of time during which a particular area of the material is exposed to the plasma plume, which may range from $1 \times 10^{-9}$ s to $1 \times 10^3$ s.

In one embodiment of the present invention, AP plasma source 102 has a converging nozzle (i.e., a straight conical cross-sectional flow area without being followed by a diverging section), has been fabricated and evaluated. The AP plasma source repeatably and reliably produces a plasma plume which may include the production of shock waves. The AP plasma source generates an air plasma using air at about room temperature as the feed gas. The air may be fed to an AP plasma source of this type at a pressure ranging from 30-110 psi and at a flow rate ranging from 1-7.5 CFM. In another example, the pressure range is 65-95 psi. In another example, the flow rate range is 1-4 CFM. Pressures higher than 110 psi may also be implemented to produce shock waves. In a more general example, the pressure may be 30 psi or greater and the flow rate may be 1 CFM or greater.

Under these conditions, at plasma ignition, there is a (typically small) arc from the driven or "electrically hot" electrode to the chamber wall, and the gas flow "expands" the spatially confined arc into a diffused volume of plasma or plasma plume 118 extending out of the outlet 114. The electrical impedance before and after plasma ignition and during the expansion of the arc vary greatly as detailed below.

Figure 1B:
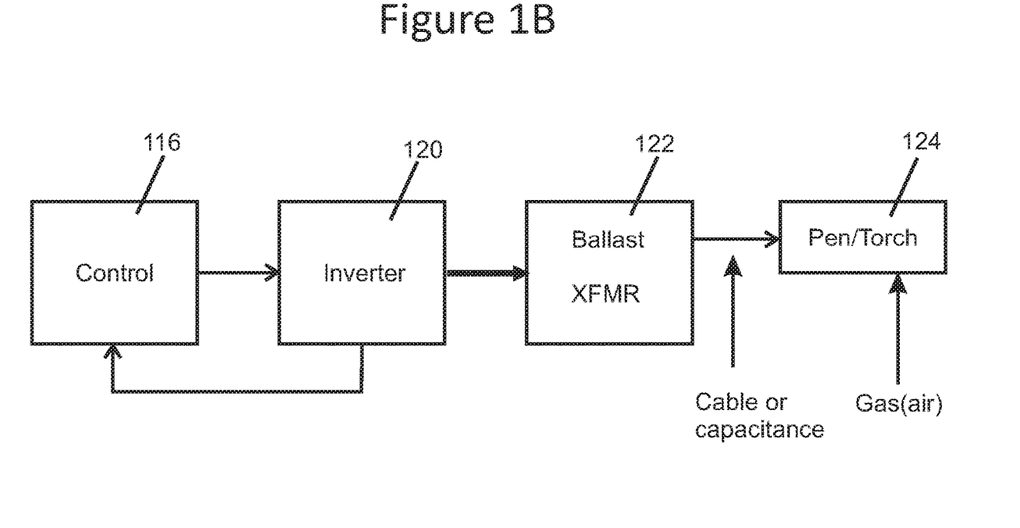
FIG. 1B is a schematic of a system for coupling power to an atmospheric plasma.

The present invention provides as shown in FIG. 1B a system for providing power to the plasma during these changing load resistance conditions by way of an inverter 120 (controlling for example the AC frequency of a square wave pulse signal) and a ballast transformer 122. In this system, a leakage inductance of the ballast transformer 122 serves the purposes of both a) limiting the current into a variable load when driven by a fixed voltage AC source and b) providing a resonance with cable capacitance and therefore can provide a high voltage to ignite a plasma.

Figure 2:
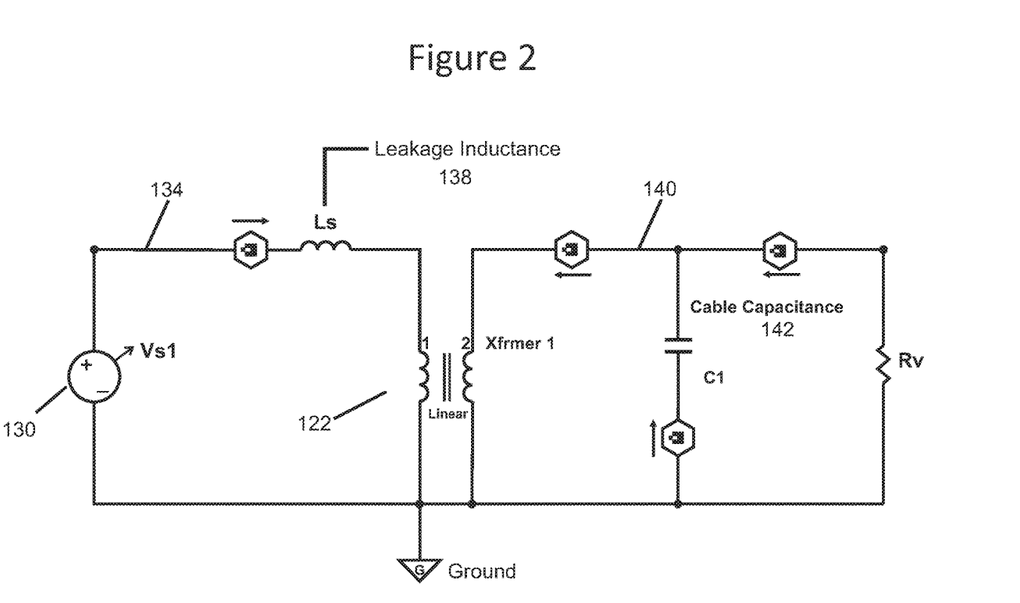
FIG. 2 is a schematic circuit model of a ballast transformer coupled to a variable resistance load.

FIG. 2 is a schematic circuit model of asymmetric ballast transformer 122 of the present invention for coupling to a variable load Rv such as a plasma load, including but not limited to an atmospheric pressure plasma pen (discussed above) or a cutting torch (discussed below). As shown in FIG. 2, an AC voltage source 130 is coupled to transformer 122 by coupling connections 134. The AC voltage source can provide an AC waveform which may be sinusoidal, square wave, or other arbitrary pulsed or bi-polar waveform, and provide a waveform whose frequency can be varied. The voltage source 130 supplies current which flows through the primary windings 1. The current through windings 1 induce current flow through the secondary windings 2 of transformer 102, producing a step up or step down AC voltage which appears across the variable plasma load $R_v$. A coaxial connection 140 is used in this circuit to connect the transformer 122 to the variable plasma load $R_v$, but other types of electrical interconnects with or without filtering could be used in addition or instead of the coaxial connection 140. As shown in FIG. 2, a leakage inductance 138 and cable capacitance 142 (from the coaxial cable) appear in this circuit.

In general, ballast transformers have a leakage inductance that appears in a simple analysis as a separate inductor (leakage inductor) in series with the primary and or the secondary. If the leakage inductance is sufficiently large, the present inventors have realized (as noted above) that this leakage inductance will serve both to a) limit the current into a variable load when driven by a fixed voltage AC source and b) provide a resonance (with the cable capacitance) and therefore can provide a high voltage to ignite a plasma.

Existing transformers with a two pole or three pole transformer core require either a larger core with lower magnetic path length to cross sectional area ratio and extra magnetic path extension in the transformer core in order to reduce coupling to an acceptable value where a transient load would not adversely affect a voltage source such as voltage source 130. Alternatively, the transformer would need finer wire with more turns and thick bobbin walls for a coaxial design on a two pole transformer core in order to suppress current surges. Both of these approaches are undesirable.

Accordingly, the present inventors have realized that, for a conventional two pole core design to suppress current surges, a set of large bobbins along with a fine wire size would be necessary. Indeed, because of the limited wire sizes that are practical, many turns would be necessary to achieve a sufficient flux density. Yet, this approach comes with excessive wire heating even for a 1-3 kW transformer for example having a ~50-100 mm (height and width) 2 pole transformer core, with a core area of each pole being ~320 mm$^2$-60 mm$^2$. Furthermore, the present inventors have realized that, if only a single primary winding were placed on one pole of the core and only a secondary winding were on the other pole, then it is impossible to obtain coupling as high as 0.97.

Accordingly, using conventional measures, one either a) obtains a transformer with limited power rating or b) cannot obtain enough coupling. These deficiencies are especially problematic when the variable load is a plasma, where the on state and the off state present a tremendous change in impedance nearly instantly, which can result in excessive current flow and damage to the power supply and power coupling equipment.

Asymmetric Ballast Transformer

In view of the problems noted above for the ignition and operation of an atmospheric pressure plasma, the present inventors have devised a solution utilizing both a two pole winding design with a coaxial winding of a second primary winding on the secondary side of a transformer, This solution provides an asymmetric ballast transformer permitting adjustment of the primary windings so that some of the primary windings are on the primary pole and the rest of the primary windings are disposed in a vicinity of and preferably coaxial with the high voltage secondary coil on the second pole.

Figure 3:
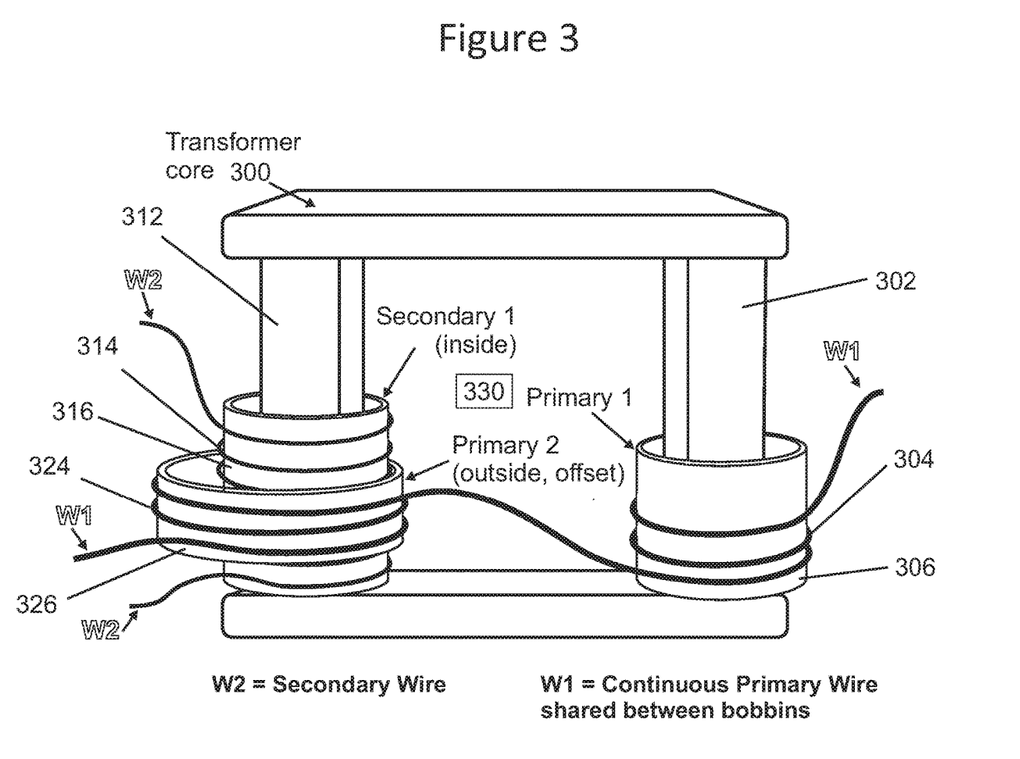
FIG. 3 is a schematic of an asymmetrical ballast transformer of the present invention.

FIG. 3 is a schematic of a ballast transformer of the present invention. As shown in FIG. 3, a magnetic flux circuit comprises a transformer core 300 forming a magnetic loop (which could include air gaps not shown) linking a primary side 302 of the transformer to a secondary side 312 of the transformer. The primary side 302 comprises a first primary winding 304 of wire W1 on bobbin 306. Wire W1 connects to an AC power source (not shown in FIG. 3), but similar to voltage source 130 in FIG. 2. The secondary side 312 comprises a second winding 314 of wire W2 on bobbin 316. Wire W2 connects to a variable load not shown in FIG. 3, but similar to variable load Rv in FIG. 2.

In FIG. 3, bobbin 316 is illustrated for a high voltage secondary. Bobbin 316 has wire W1 wound around it. In one embodiment of the invention, bobbin 316 fits inside primary bobbin 326 to provide coupling thereto. The position of primary bobbin 326 on the second pole can vary from design to design to provide an adjustable coupling to the secondary winding 324 and/or to the transformer core 300. Primary bobbin 326 typically has a lower coupling to the transformer core than either the secondary winding 324 or the primary winding 304 on bobbins 316 and 306, respectively.

In one embodiment of the invention, the required number of turns for the transformer's primary are distributed between the two primary bobbins 306 and 326 in order to set the coupling for an appropriate leakage inductance, while the total number of windings on the primary bobbins remains the same as if there were only one primary bobbin, thus obtaining appropriate excitation or magnetization inductance, and thereby controlling maximum flux while allowing larger wires on the bobbins than otherwise would be the case when the primary windings were coaxial on only one pole. In one embodiment of the invention, bobbin 326 is insulated although insulation may not be necessary if bobbin 326 is of a size to where it can reside at the bottom of the secondary winding where the voltage is lower than at the top side of the secondary windings.

Accordingly, in one embodiment of the invention, the primary winding on transformer core 300 is split by the presence of second primary winding 324 in proximity to (e.g., wrapped around or coaxially surrounding) the secondary winding 314. This second primary winding 324 (connected in series with the winding primary winding 304) can be a non-coaxial and/or a coaxial winding relative to the secondary winding 314 so that it is possible to control the coupling coefficient (leakage inductance) and optimize the trade-off between maximum flux density, core heating, and wire losses without the necessity of auxiliary adjustable flux paths. In one embodiment, the relative positions of bobbin 306, bobbin 316, and/or bobbin 326 to the transformer core (and/or to each other) can be adjusted or can otherwise be fixed at different relative positions.

In one embodiment of the invention, by keeping the number of turns constant, the exact coupling may be adjusted by moving turns from primary 1 (winding 304) to primary 2 (winding 324) or vice versa. In effect, turns can be moved back and forth between primary bobbins to adjust the coupling and leakage inductance. If more turns are on primary 2 and less on primary 1, then the coupling is increased without affecting the turns ratio or open circuit (no load) output voltage. Reversing the situation, more turns on primary 1 and less on primary 2 decreases the coupling. Less coupling makes the leakage inductance increase while more coupling makes it decrease.

The numerical values given below are merely illustrative and not limiting of a asymmetrical ballast transformer of the present invention. Typical values for operation of the ballast transformer of the present invention are 0-350 mTeslas, 0.97 coupling on primary, net loss<50 W between 20-500 kHz, 1 kV-50 kV peak volts pre-ignition, 0.50-5 kV volt peak operating, 0 volts output post-ignition state.

Below are details of a constructed asymmetrical ballast transformer of the present invention.

Ballast Transformer Design

Operational Input: Pulsed 300 V above ground signal at pulse frequency from 20-500 kHz
Transformer Design:
  Primary Rating: 230 VAC
  Epoxy coating or other coating to hold primary wire and secondary wire in place on bobbins and to prevent vibration in use.
  First Primary Winding: wire size #12 AWG, 1-15 turns
  First Primary Winding Inductance: 0.5-10 µH at 10 KHz, no core
  Second Primary Winding: wire size #12 AWG, 1-15 turns
  Second Primary Winding Inductance: 0.5-10 pH at 10 KHz, no core
  Total Primary Windings: 2-30 turns
  Total Primary Winding Inductance: 500-2000 µH at 10 KHz, with core, Q=300

Secondary Winding: wire size #22 AWG, ~200 turns, layered windings

Secondary Winding Inductance: 100 to 1000 µH at 10 kHz, no core 50 to 5000 mH at 10 kHz, with core, Q=500

Measured Leakage Inductance: 5-100 µH at 10 kHz, with core, Q=30

A further embodiment of the present invention is that bobbin 326 can be disposed offset from the transformer core, that is that the primary wire W1 on bobbin 326 is moved away from the core (where the operating flux and thus heating is the greatest). Flux near wire W1 is somewhat higher than elsewhere in the core.

Further, in another embodiment, the bobbin may be perforated for air flow or liquid cooling tubes along the core inside of the winding. In some cases, it is also advantageous to offset bobbin 326 on the core to allow more wire exposure into the window region 330 of the transformer core, and thereby move the magnetic flux distribution in the core to prevent localized saturation of the core. FIG. 3 shows bobbin 326 in one offset position, but it is also possible to have bobbin 326 centered around bobbin 316 and to only offset bobbin 306 on the primary side of the transformer.

Coil layers of the windings on the bobbins may also be separated for better cooling and less current crowding. Flux is not the same around the core during any mode of operation since the circuit with capacitive output causes significant circulating current so that the circulating power is typically 1.6 times the real output power. Such a relationship is necessary for ballasting. The transformer core may be un-gapped for maximum power output, but in another embodiments a gapped core is utilized to minimize saturation. This design does not necessarily have, but could utilize, a center tapped primary although center tapping would reduce power handling and/or increase size.

In one embodiment of the invention, the primary bobbin 306 (as noted above) is offset from primary side 302 of the transformer core. This offset allows magnetic flux to leak out and be intercepted by second primary winding 324 wound on bobbin 326.

In one embodiment of the invention, one of the primary or secondary windings provides tight coupling while the other provides loose coupling while simultaneously providing a) enough leakage inductance to limit flux density to a safe level, b) at least a turns ratio to develop the operating or developed plasma voltage and more, and c) a reasonable leakage inductance for resonance condition for ignition and use that same leakage inductance for ballast when there is a developed plasma. In one embodiment of the invention, the leakage is adjusted by construction of the ballast transformer components so as not to change the turns ratio all the while keeping the transformer compact while avoiding extra ferrite flux path elements.

In one embodiment of the invention, it is desirable to minimize interwinding capacitance. As shown in FIG. 3, there is a two 'pole' ferrite core but the primary is not wound over the top of the ferrite core and the secondary is not wound over the top of the ferrite core. This is to avoid electrostatic stray capacitive coupling between the primary and secondary. Furthermore, in one embodiment of the invention, one part of the primary coaxial to the secondary is at the 'grounded' or low voltage end. This arrangement further reduces the effect of stray capacitive coupling by grounding that end of the secondary winding. At plasma ignition, the plasma impedance transitions very quickly between very high (megaohms or greater) impedance to a near short circuit (less than an Ohm). This means the load voltage on the plasma electrode drops rapidly (for example in a very few nanoseconds) which can generate a large capacitively coupled transient into the primary which can damage the drive devices in control 116 or inverter 120 like IGBTs or FETs. In one embodiment of the invention, this effect is minimized by the open top ferrite core design shown in FIG. 3, reducing the interwinding capacitance between the primary and secondary winding.

Benefits of the present invention also not having windings 314 and 324 bet coaxial except for a small section on the cold end (the low voltage end) of secondary 312 so that high electric fields are not created at the top of secondary 312 and therefore the possibility of a damaging corona discharge in air is reduced and the interwinding capacitance is reduced. Moreover, the magnetic flux is not uniform in the core given its operation during the three operational states (ignition of arc, expansion of arc, plasma maintenance). Since the core would begin to saturate first under primary 1 (winding 304) but not under primary 2 (winding 324) where the magnetic flux is much less, core saturation events that could damage the driving circuit control 116 (due to high currents in turn due to loss of inductance) can be detected, and the inverter 120 drive shut down before damage occurs.

One optional embodiment of the inventive asymmetric ballast transformer design is that the bobbins, if needed, can be stacked end-to-end against each other using their end flanges so that no spacer is required.

Another optional embodiment of the inventive asymmetric ballast transformer design is that the primary is not necessarily disposed over the high voltage end of the secondary, thereby avoiding most of the capacitive coupling which is one significant way that ignition transients can be transferred from the spark gap in the torch/pen to the primary and to the transistor bridge devices (control 116 and inverter 120) in the voltage source. This disposal of the primary not over the high voltage end of the secondary may also improve cooling to the secondary side of the transformer compared to a coaxial design which would require more turns and finer wire, and thus be limited to lower operational powers.

Typically, for the asymmetrical ballast transformer of the present invention, a coupling coefficient is about 0.97, and a magnetization inductance (inductance of the primary winding 304 and secondary winding 314) is about 30 times greater than the leakage inductance. According to one embodiment of the invention, the leakage inductance is preferably of a value that limits current in the primary side at the instant the plasma ignites. Plasma ignition represents a tremendous change in impedance from that of an open circuit prior to ignition to that appearing almost as a short circuit after plasma ignition.

Figure 4:
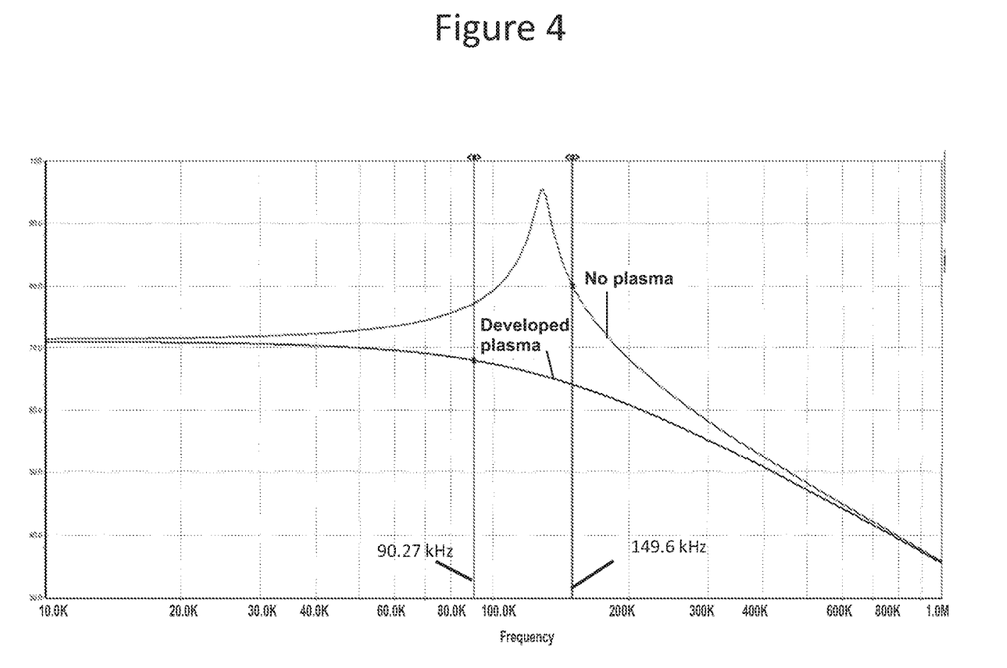
FIG. 4 is a schematic graph of frequency vs impedance sweep of using a ballast transformer for different loads.

FIG. 4 is a graph of frequency vs impedance sweep characteristic of the ballast transformer circuit for a "no plasma" case and for a developed plasma case. Two points/frequencies marked are for plasma operation (to the left, 90.27 kHz) and pre-ignition (to the right, 149.6 kHz). These frequencies will vary with a particular coax cable type and length (FIG. 2, coaxial cable 140 and its cable capacitance 142). If the cable capacitance changes, the operating points/frequencies change for the same output. Note the scale depicted is magnitude dB relative to 1 volt at the output of the cable (i.e. at the pen/torch/plasma port). 80 dB volt is 10,000 volts. 68 dB volt is 2,500 volts amplitude or peak. In FIG. 4, the no plasma curve represents a very high load impedance (here calculated for 100 k Ohms, but it may be 1 megaohm or higher). In FIG. 4, the fully developed plasma curve represents a load of 2000 Ohms. The type of plasma pen/torch used for these calculations was assumed to be a high voltage plasma type with a relatively high impedance while running.

In one embodiment of the invention, the frequency of operation can be moved from 149.6 kHz toward a lower frequency (toward the peak resonance frequency) in order to develop higher ignition voltages (than would exist at 149.6 kHz) and thereafter moved to even lower frequencies (once ignited) to couple more plasma power once ignited and developed.

Figure 5:
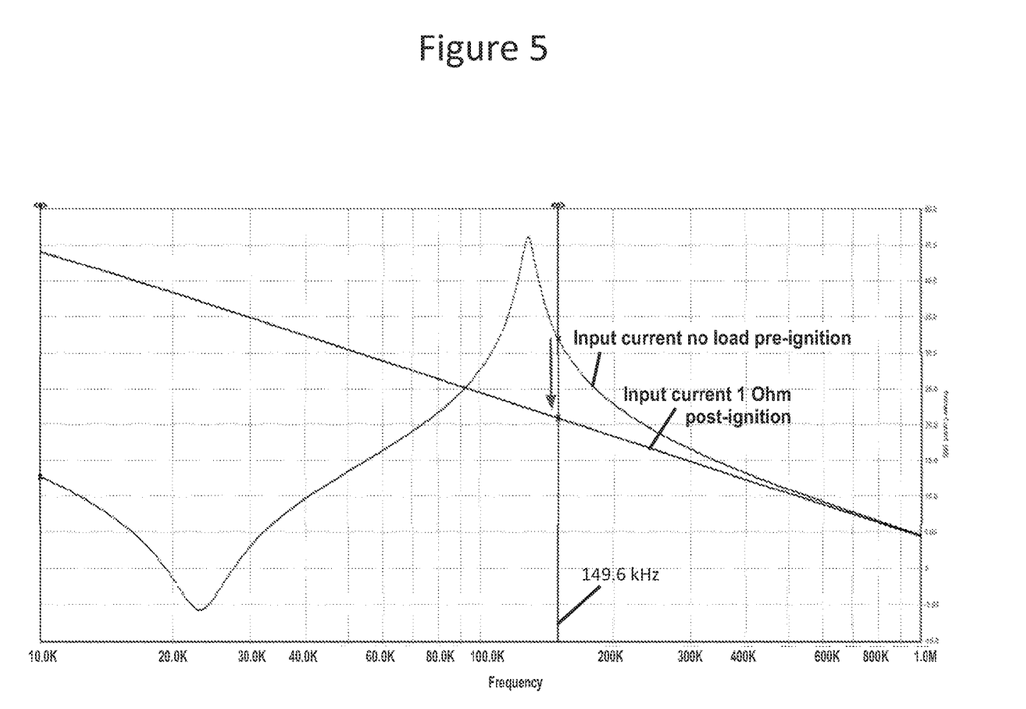
FIG. 5 is a schematic graph of a current transfer frequency sweep for different loads coupled to a ballast transformer, one with no load (pre-ignition of plasma) and the other at post-ignition.
Figure 6:
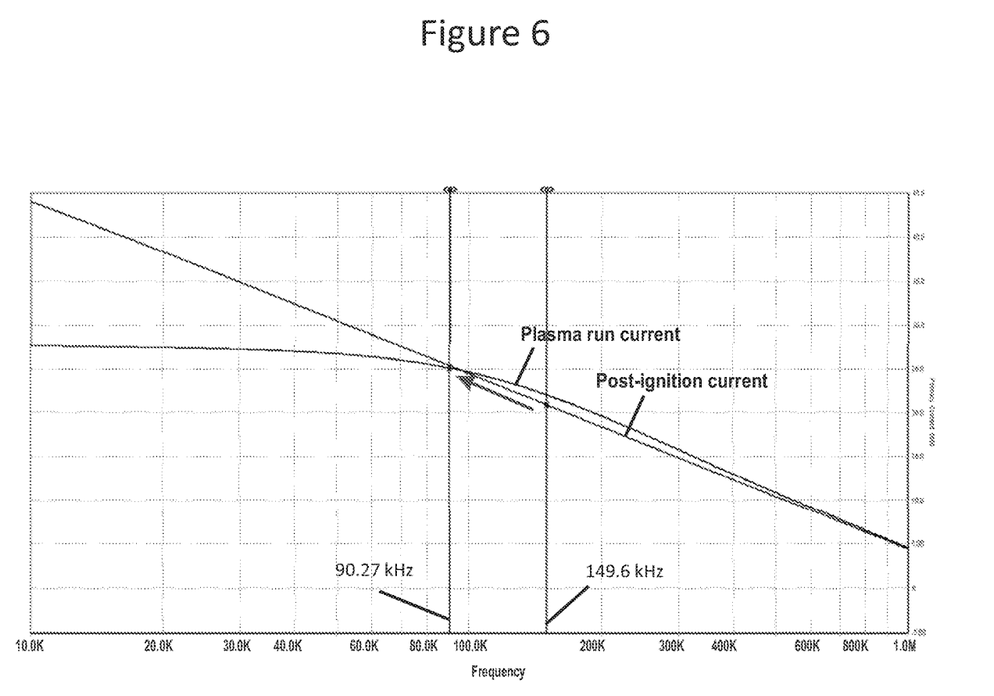
FIG. 6 is a schematic graph of a current transfer frequency sweep for a post ignition plasma load and a fully developed plasma load.

One plasma condition that is not shown in FIG. 4 is the state immediately post ignition when the plasma is spatially confined into a conductive filament small in size and has an impedance of 1 Ohm or less. This condition is depicted in FIG. 5, a graph comparing input current for pre-ignition and post-ignition. In FIG. 5, the scale on the right is in dB Amperes relative to 1 Ampere peak. Specifically, FIG. 5 shows the input current as a function of frequency for a no load pre-ignition, and shows the input current as a function of frequency for a 1 Ohm post-ignition state (not a fully developed plasma). At startup, the input current with no load condition (simulation is 100 k Ohms) is at about 32 dB or 39.8 Amperes peak. When the plasma ignites, the input current is relatively small and has a relatively low impedance as compared to the fully developed plasma state and simulated here with a resistance 1 Ohm. Note that the input current at plasma ignition actually drops to about 21 dB or 11.2 Amperes peak. Thereafter, as shown in FIG. 6, the plasma develops and the input current increases as the frequency of operation is lowered to 90.27 kHz or lower.

More specifically, as the plasma develops, the impedance increases moving the current from the post-ignition current curve to the plasma-run current curve, and the frequency is adjusted to 90.27 kHz in this example to develop full power. Thus the ballast transformer is used to permit the system to generate ignition voltages (FIG. 4), withstand the sudden load transition from very high to near shorted conditions (FIG. 5) and then smoothly move to full power plasma (FIG. 6).

In general, a number of advantages are provided by inventive asymmetric ballast transformer of the present invention including but not limited to:
  one can separately specify the number of primary turns and thus the excitation flux of the transformer to control heating, possible core saturation, and the coupling coefficient;
  the lower capacitive coupling between primary and secondary compared to a single pole coaxial winding deign results in lower transient transfer from the secondary side to the primary side, while nevertheless obtaining the coupling benefits from a coaxial winding at the bottom of the HV bobbin; and
  the secondary windings need not be covered (or vice versa the primary winding is not covered) for the most part, and thus can be cooled more effectively.

The ballast transformer of this invention may work with any turns ratio including for example those less than 1 which could be used to drive low impedance cutting torches. Ignition with these work tools is a problem typically requiring contact and withdrawal of the electrode. It would be preferable if its power coupling could also be current-limited or ballasted in some way. While the cable capacitance in conventional cutting torches is almost non-existent (because the transformer is placed closed to the working electrode), in the present invention, a larger than conventional cable capacitance (or a supplemental capacitor to ground) could be used in order for enough voltage to develop under a no load condition to ignite the torch. In this case, add on igniters as conventionally used may be avoided. For example, U.S. Pat. No. 7,022,935 (the entire contents of which are incorporated herein by reference) describes a plasma cutting torch having an output electrode and a plasma cutter starting circuit configured to generate a pilot arc at the output electrode.

Hence, the "pen/torch" reference in FIG. 1B and the variable plasma resistance of FIG. 2 refer to the present invention's utility in these types of cutting torches typically having low impedances.

Computer Control

It will be understood that the control 116 schematically illustrated in FIGS. 1A and 1B may also be representative of one or more types of user devices, such as user input devices (e.g., keypad, touch screen, mouse, and the like), user output devices (e.g., display screen, printer, visual indicators or alerts, audible indicators or alerts, and the like). Control 116 may have a graphical user interface (GUI) controlled by software for display by an output device, and one or more devices for loading media readable by the controller 212 (e.g., logic instructions embodied in software, data, and the like). The control 116 may include an operating system (e.g., Microsoft Windows® software) for controlling and managing various functions thereof.

Figure 7:
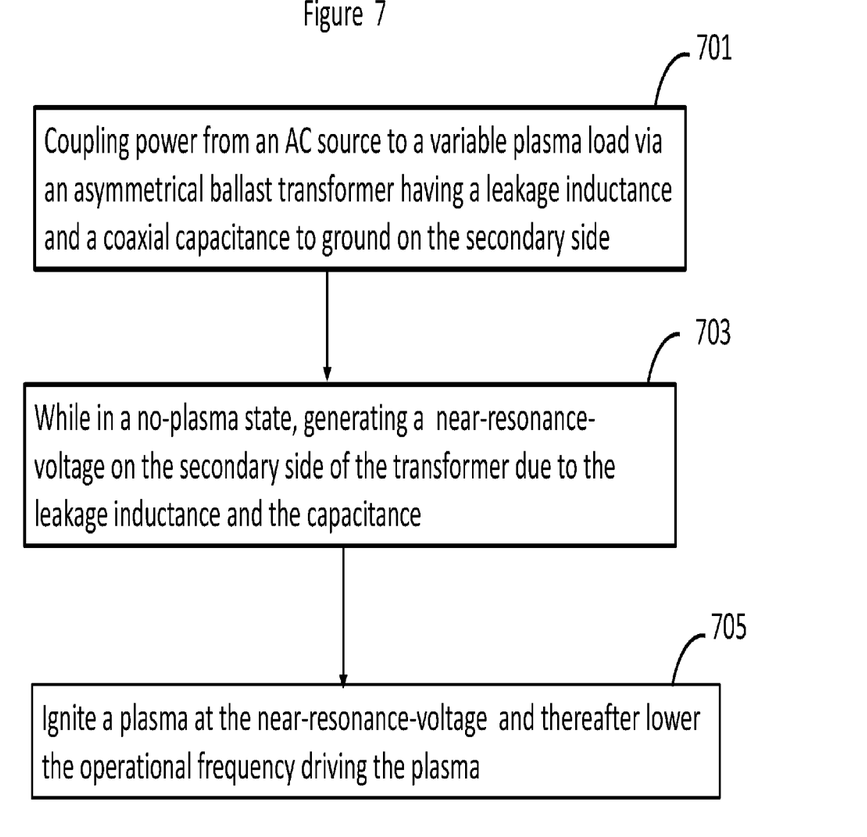
FIG. 7 is a flow chart detailing a method of the present invention for coupling an alternating current (AC) voltage source to a load.

FIG. 7 is a flowchart detailing a method of the present invention for powering a plasma load.

In step 701, coupling power from an AC source to a variable plasma load via an asymmetric ballast transformer having a leakage inductance and a coaxial capacitance to ground. The variable plasma load comprising for example the atmospheric pressure plasma source or the low impedance cutting torches discussed above.

In step 703, while in a no-plasma state, generating a near resonance-voltage on the secondary side due to the leakage inductance and the capacitance.

In step 705, ignite a plasma at the near-resonance-voltage, and thereafter lower the operational frequency driving the plasma. In this step, the fully developed plasma load is resistive with the leakage inductance acting as a low pass filter preventing high frequency transients from propagating backwards into the AC source.

Viewed differently, these steps in general provide power from an AC power source to a plasma load via an asymmetric ballast transformer having a sufficient leakage inductance to prevent current surges; and ignite and develop a full atmospheric pressure plasma.

It will be understood that one or more of the processes, sub-processes, and process steps described herein may be performed by hardware, firmware, software, or a combination of two or more of the foregoing, on one or more electronic or digitally-controlled devices for example adjusting the variable capacitors and/or the relative bobbin positions and/or the power level of the AC source 130. The software may reside in a software memory (not shown) in a suitable electronic processing component or system such as, for example, the control 116 schematically depicted in FIG. 1A. The software memory may include an ordered listing of executable instructions for implementing logical functions (that is, "logic" that may be implemented in digital form such as digital circuitry or source code, or in analog form such as an analog source such as an analog electrical, sound, or video signal). The instructions may be executed within a processing module, which includes, for example, one or more microprocessors, general purpose processors, combinations of processors, digital signal processors (DSPs), or application specific integrated circuits (ASICs). Further, the schematic diagrams describe a logical division of functions having physical (hardware and/or software) implementations that are not limited by architecture or the physical layout of the functions. The examples of systems described herein may be implemented in a variety of configurations and operate as hardware/software components in a single hardware/software unit, or in separate hardware/software units.

The executable instructions may be implemented as a computer program product having instructions stored therein which, when executed by a processing module of an electronic system (e.g., the control 116 schematically depicted in FIG. 1A), direct the electronic system to carry out the instructions. The computer program product may be selectively embodied in any non-transitory computer-readable storage medium for use by or in connection with an instruction execution system, apparatus, or device, such as a electronic computer-based system, processor-containing system, or other system that may selectively fetch the instructions from the instruction execution system, apparatus, or device and execute the instructions. In the context of this disclosure, a computer-readable storage medium is any non-transitory means that may store the program for use by or in connection with the instruction execution system, apparatus, or device. The non-transitory computer-readable storage medium may selectively be, for example, an electronic, magnetic, optical, electromagnetic, infrared, or semiconductor system, apparatus, or device. A non-exhaustive list of more specific examples of non-transitory computer readable media include: an electrical connection having one or more wires (electronic); a portable computer diskette (magnetic); a random access memory (electronic); a read-only memory (electronic); an erasable programmable read only memory such as, for example, flash memory (electronic); a compact disc memory such as, for example, CD-ROM, CD-R, CD-RW (optical); and digital versatile disc memory, i.e., DVD (optical). Note that the non-transitory computer-readable storage medium may even be paper or another suitable medium upon which the program is printed, as the program can be electronically captured via, for instance, optical scanning of the paper or other medium, then compiled, interpreted, or otherwise processed in a suitable manner if necessary, and then stored in a computer memory or machine memory.

It will also be understood that the term "in signal communication" as used herein means that two or more systems, devices, components, modules, or sub-modules are capable of communicating with each other via signals that travel over some type of signal path. The signals may be communication, power, data, or energy signals, which may communicate information, power, or energy from a first system, device, component, module, or sub-module to a second system, device, component, module, or sub-module along a signal path between the first and second system, device, component, module, or sub-module. The signal paths may include physical, electrical, magnetic, electromagnetic, electrochemical, optical, wired, or wireless connections. The signal paths may also include additional systems, devices, components, modules, or sub-modules between the first and second system, device, component, module, or sub-module.

More generally, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

Exemplary Statements of the Invention

The following numbered statements of the invention set forth a number of inventive aspects of the present invention:

Statement 1. A ballast transformer having a magnetic core (optionally including gaps), a first primary winding on a primary side of the magnetic core, a secondary winding on a secondary side of the magnetic core, and a second primary winding connected in series with the first primary winding and wound coaxial to the secondary winding on the secondary side of the magnetic core.

Statement 2. The ballast transformer of statement 1, having a resonance associated with a capacitance of a cable connected to the secondary winding and a leakage inductance of the transformer.

Statement 3. The ballast transformer of statement 2, wherein the resonance may be associated with a capacitance of a capacitor connected to ground from a power lead connected to the secondary winding.

Statement 4. The ballast transformer of statement 2, wherein the resonance comprises a high Q circuit when no load is present.

Statement 5. The ballast transformer of statement 2, wherein the leakage inductance opposes current surges at plasma ignition.

Statement 6. The ballast transformer of statement 1, wherein the ballast transformer comprises a step-up transformer or a step-down transformer.

Statement 7. The ballast transformer of statement 1, wherein the second primary winding is displaceable from the secondary winding to alter a coupling coefficient of the transformer.

Statement 8. The ballast transformer of statement 1, wherein the second primary winding is displaceable from the secondary winding to alter a resonance frequency of the resonant transformer.

Statement 9. The ballast transformer of statement 1, wherein the second primary winding wraps around or coaxially surrounds the secondary winding.

Statement 10. The ballast transformer of statement 1, wherein the second primary winding is offset axially from and surrounds the secondary winding.

Statement 11. The ballast transformer of statement 1, wherein the second primary winding is displaceable from the secondary winding to alter a coupling coefficient of the transformer.

Statement 12. The ballast transformer of statement 1, wherein the second primary winding is displaceable from the secondary winding to alter a resonance frequency of the resonant transformer.

Statement 13. The ballast transformer of statement 1, further comprising respective bobbins for holding the first primary winding, the secondary winding, and the second primary windings in place around the magnetic core.

Statement 14. The ballast transformer of statement 1, wherein the respective bobbins have holes for air cooling.

Statement 15. The ballast transformer of statement 1, wherein at least one of the first primary winding and the secondary winding is disposed offset from the magnetic core or the first primary winding is offset axially from the magnetic core.

Statement 16. A system for coupling power to a plasma load, the system comprising:

an alternating current (AC) power source;
the ballast transformer of any one or more of statements 1-15;
wherein
the first primary winding of the ballast is connectable to the AC power source, and
the secondary winding of the ballast is connectable to the plasma load by a coaxial cable.

Statement 17. The system of statement 16, wherein the ballast transformer comprises a resonant transformer having a resonance associated with a) a capacitance of the coaxial cable connected to the secondary wining and b) a leakage inductance of the ballast transformer.

Statement 18. The system of statement 16, wherein the ballast transformer comprises a step-up transformer or a step-down transformer.

Statement 19. The system of statement 16, wherein the ballast transformer comprises a resonant transformer having resonance associated with a) a capacitance of the coaxial cable and b) a leakage inductance of the transformer.

Statement 20. The system of statement 16, further comprising a plasma-generating region connected in series with the secondary winding via the coaxial cable.

Statement 21. The system of statement 20, wherein the ballast transformer comprises a high Q circuit when no plasma exists in the plasma generating region and comprises a non-resonant resistive circuit when a plasma exists in the plasma generating region.

Statement 22. The system of statement 21, wherein a leakage inductance of the ballast transformer opposes current surges at plasma ignition.

Statement 23. The system of statement 22, wherein the second primary winding is displaceable from the secondary winding to alter a coupling coefficient of the transformer.

Statement 24. The system of statement 22, wherein the second primary winding is displaceable from the secondary winding to alter a resonance frequency of the resonant transformer before plasma ignition.

Statement 25. The system of statement 16, wherein the variable plasma load comprises an atmospheric pressure plasma or a cutting torch and/or the variable plasma load plasma comprises a non-thermal plasma used for the removal of organic contaminants, coatings, adhesives and sealants from surfaces.

Statement 26. The system of statement 16, wherein the second primary winding wraps around or coaxially surrounds the secondary winding.

Statement 27. The system of statement 16, wherein the second primary winding is offset axially from and surrounds the secondary winding.

Statement 28. The system of statement 16, wherein the second primary winding is displaceable from the secondary winding to alter a coupling coefficient of the transformer.

Statement 29. The system of statement 16, wherein the second primary winding is displaceable from the secondary winding to alter a resonance frequency of the resonant transformer.

Statement 30. The system of statement 16, further comprising respective bobbins for holding the first primary winding, the secondary winding, and the second primary windings in place around the magnetic core.

Statement 31. The system of statement 16, wherein the respective bobbins have holes for air cooling.

Statement 32. The system of statement 16, wherein at least one of the first primary winding and the secondary winding is disposed offset from the magnetic core.

Statement 33. The system of statement 1, further comprising a controller configured to at least one of:
control a gas flow through the plasma load, and
control an operational frequency of the AC power source.

Statement 34. The system of statement 33, wherein the controller is configured to:
via the ballast transformer in statement 1 comprising an asymmetric ballast transformer having a sufficient leakage inductance to prevent current surges, control the AC power source such that a plasma is ignited and developed into a steady state atmospheric pressure plasma.

Statement 35. A method using any of the system statements above for providing/coupling power to a plasma load, the method comprising:
coupling power from the AC power source to the plasma load via an asymmetric ballast transformer having a leakage inductance and attached to a coaxial cable with capacitance;
while in a no-plasma state, generating a near-resonance voltage on the secondary side due to the leakage inductance and the capacitance; and
igniting a plasma at the near-resonance voltage and thereafter decreasing an operational frequency of the AC power source.

Statement 35. A method using any of the system statements above for providing/coupling power to a plasma load, the method comprising:
providing power from an AC power source to a plasma load via the asymmetric ballast transformer in any of the statements above having a sufficient leakage inductance to prevent current surges; and
igniting and developing a steady state atmospheric pressure plasma.

Numerous modifications and variations of the invention are possible in light of the above teachings. It is therefore to be understood that within the scope of the appended claims, the invention may be practiced otherwise than as specifically described herein.

The invention claimed is:

1. A system for coupling power to a plasma load, comprising:
   an alternating current (AC) power source;
   a ballast transformer having
      a magnetic core,
      a first primary winding on a primary side of the magnetic core and connected to the AC power source,
      a secondary winding on a secondary side of the magnetic core, and
      a second primary winding connected in series with the first primary winding and wound coaxial to the secondary winding on the secondary side of the magnetic core; and
   a coaxial cable for connecting the secondary winding to the plasma load,
   wherein the ballast transformer comprises a resonant transformer having a resonance associated with a) a capacitance of the coaxial cable connected to the secondary wining and b) a leakage inductance of the ballast transformer.

2. The system of claim 1, wherein the ballast transformer comprises a step-up transformer or a step-down transformer.

3. The system of claim 2, further comprising a plasma-generating region connected in series with the secondary winding via the coaxial cable.

4. The system of claim 3, wherein the ballast transformer comprises a high Q circuit when no plasma exists in the plasma generating region and comprises a non-resonating, resistive circuit when a plasma exists in the plasma generating region.

5. The system of claim 4, wherein a leakage inductance of the ballast transformer opposes current surges when the plasma is ignited in the plasma generating region.

6. The system of claim 5, wherein the second primary winding is displaceable from the secondary winding to alter a coupling coefficient of the ballast transformer.

7. The system of claim 1, wherein the plasma comprises an atmospheric pressure plasma.

8. The system of claim 1, wherein the plasma comprises a non-thermal plasma used for the removal of organic contaminants, coatings, adhesives and sealants.

9. The system of claim 1, wherein the second primary winding wraps around the secondary winding.

10. The system of claim 1, wherein the second primary winding is offset axially from the secondary winding.

11. The system of claim 1, wherein the second primary winding is displaceable from the secondary winding to alter a coupling coefficient of the transformer.

12. The system of claim 1, further comprising respective bobbins for holding the first primary winding, the secondary winding, and the second primary windings in place around the magnetic core.

13. The system of claim 1, wherein the respective bobbins have holes for air cooling.

14. The system of claim 1, wherein annular gaps between bobbins supporting either the first primary winding, the second primary winding or the secondary winding provide cooling air.

15. The system of claim 1, wherein at least one of the first primary winding and the secondary winding is disposed offset from the magnetic core.

16. The system of claim 11, wherein the first primary winding is offset axially from the magnetic core.

17. The system of claim 1, wherein the alternating current (AC) power source comprises a square wave inverter.

18. The system of claim 1, further comprising a controller configured to at least one of:
   control a gas flow through the plasma load, and
   control an operational frequency of the AC power source.

19. The system of claim 18, wherein the controller is configured to:
   via the ballast transformer in claim 1 comprising an asymmetric ballast transformer having a sufficient leakage inductance to prevent current surges, control the AC power source such that a plasma is ignited and developed into a steady state atmospheric pressure plasma.

20. A method using any of the system statements above for providing power to a plasma, the method comprising:
   providing power from an AC power source to a plasma load via the asymmetric ballast transformer in any of the statements above having a sufficient leakage inductance to prevent current surges; and
   igniting and developing a steady state atmospheric pressure plasma.

* * * * *